(12) United States Patent
Li et al.

(10) Patent No.: US 7,576,989 B2
(45) Date of Patent: Aug. 18, 2009

(54) HEAT SINK ASSEMBLY HAVING SUPPORTING CLIP

(75) Inventors: Dong-Yun Li, Shenzhen (CN); Jian Yang, Shenzhen (CN); Jing Zhang, Shenzhen (CN)

(73) Assignees: Fu Zhun Precision Industry (Shen Zhen) Co., Ltd., Shenzen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 49 days.

(21) Appl. No.: 11/964,837

(22) Filed: Dec. 27, 2007

(65) Prior Publication Data

US 2009/0168349 A1 Jul. 2, 2009

(51) Int. Cl.
*H05K 7/20* (2006.01)
(52) U.S. Cl. .................. 361/719; 361/704; 361/707; 165/80.3; 165/185; 257/718; 257/719; 24/453
(58) Field of Classification Search .................. None
See application file for complete search history.

(56) References Cited

U.S. PATENT DOCUMENTS

| 6,826,054 | B2 * | 11/2004 | Liu ............................. 361/719 |
| 6,829,143 | B2 * | 12/2004 | Russell et al. ............... 361/704 |
| 7,262,969 | B2 * | 8/2007 | Lee et al. ..................... 361/704 |
| 7,342,791 | B2 * | 3/2008 | Lee et al. ..................... 361/704 |
| 7,342,796 | B2 * | 3/2008 | Aukzemas ................... 361/719 |
| 7,359,200 | B2 * | 4/2008 | Zhou et al. ................... 361/704 |
| 2007/0217159 | A1 * | 9/2007 | Long et al. ................... 361/704 |

* cited by examiner

*Primary Examiner*—Boris L Chervinsky
(74) *Attorney, Agent, or Firm*—Steven M. Reiss

(57) ABSTRACT

A heat sink assembly includes an unit and a plurality of fasteners extending through the unit for fixing the unit to a heat-generating electronic component. Each fastener comprises a bolt and a supporting clip mounted on the bolt and located at a bottom of the heat sink. The supporting clip comprises a body and a support extending from the body. When the bolt of each fastener extends through the unit and the body of the supporting clip, a distance between the bottom of the unit and the heat-generating electronic component remains unchanged with the help of the support of the supporting clip.

13 Claims, 5 Drawing Sheets

HEAT SINK ASSEMBLY HAVING SUPPORTING CLIP

BACKGROUND OF THE INVENTION

1. Field of the Invention

The present invention relates generally to a heat sink assembly being mounted on a printed circuit board, and more particularly to a heat sink assembly having supporting clips for mounting the heat sink assembly to the printed circuit board and preventing the heat sink assembly from being cocked during assembly.

2. Description of Related Art

As computer technology continues to advance, electronic components such as central processing units (CPUs) of computers are being made to provide faster operational speeds and greater functional capabilities. When a CPU operates at high speed in a computer enclosure, its temperature can increase greatly. It is desirable to dissipate the heat quickly, for example by using a heat sink assembly attached to the CPU in the enclosure. This allows the CPU and other electronic components in the enclosure to function within their normal operating temperature ranges, thereby assuring the quality of data management, storage and transfer.

A related heat sink assembly commonly comprises a base, a plurality of fins mounted on the base, a back plate located below the printed circuit board where the CPU is mounted, and four fasteners. The base defines four through holes in four corners thereof. The fasteners corresponding to the through holes of the base are used for extending through the through holes of the base to mount the base on the printed circuit board. Each fastener often comprises a bolt, a spring and an annular pad. The bolt usually has a circular head, and a shaft extending from the head and inserted into a corresponding through hole. The spring is sleeved onto the shaft and located under the head and in the corresponding through hole of the base. The pad snaps a lower portion of the shaft to support the bolt, whereby the bolt would not slide from the base before it mounted to the back plate. In assembly, the base is disposed the CPU. The head of the bolt is screwed to rotate the bolt downwardly, then a bottom portion of the bolt is driven to extend the printed circuit board and be engaged in the back plate which has been readily located below the printed circuit board. The spring is compressed between the head of the bolt and the pad to press downwardly against the printed circuit board, while the back plate is pulled by the bolt to press upwardly against the printed circuit board; therefore, the heat sink assembly is securely mounted to the printed circuit board. However, when the bolt of the fastener extends through the one of the through holes of the base and mounts one corner of the base of the heat sink on the printed circuit board, elasticity produced by the spring often renders the other corners of the base of the heat sink assembly to be cocked, which causes the assembly of the heat sink assembly unstably.

Therefore, it is desirable to provide a heat sink assembly that eliminates the aforementioned problems.

SUMMARY OF THE INVENTION

A heat sink assembly in accordance with a preferred embodiment of the present invention includes an unit and a plurality of fasteners extending through the unit for fixing the unit to a heat-generating electronic component mounted on a printed circuit board. Each fastener comprises a bolt and a supporting clip mounted on a lower portion of the bolt and located between a bottom face of the unit and the printed circuit board. The supporting clip comprises a body and a support extending from the body. When the bolt extends through the unit and the body of the supporting clip to engage with a back plate located below the printed circuit board, the supporting clip is tightly sandwiched between the bottom face of the unit and the printed circuit board, to thereby support the unit from being cocked.

Other advantages and novel features will become more apparent from the following detailed description of preferred embodiments when taken in conjunction with the accompanying drawings, in which:

BRIEF DESCRIPTION OF THE DRAWINGS

Many aspects of the present apparatus and method can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION OF THE INVENTION

Figure 1:
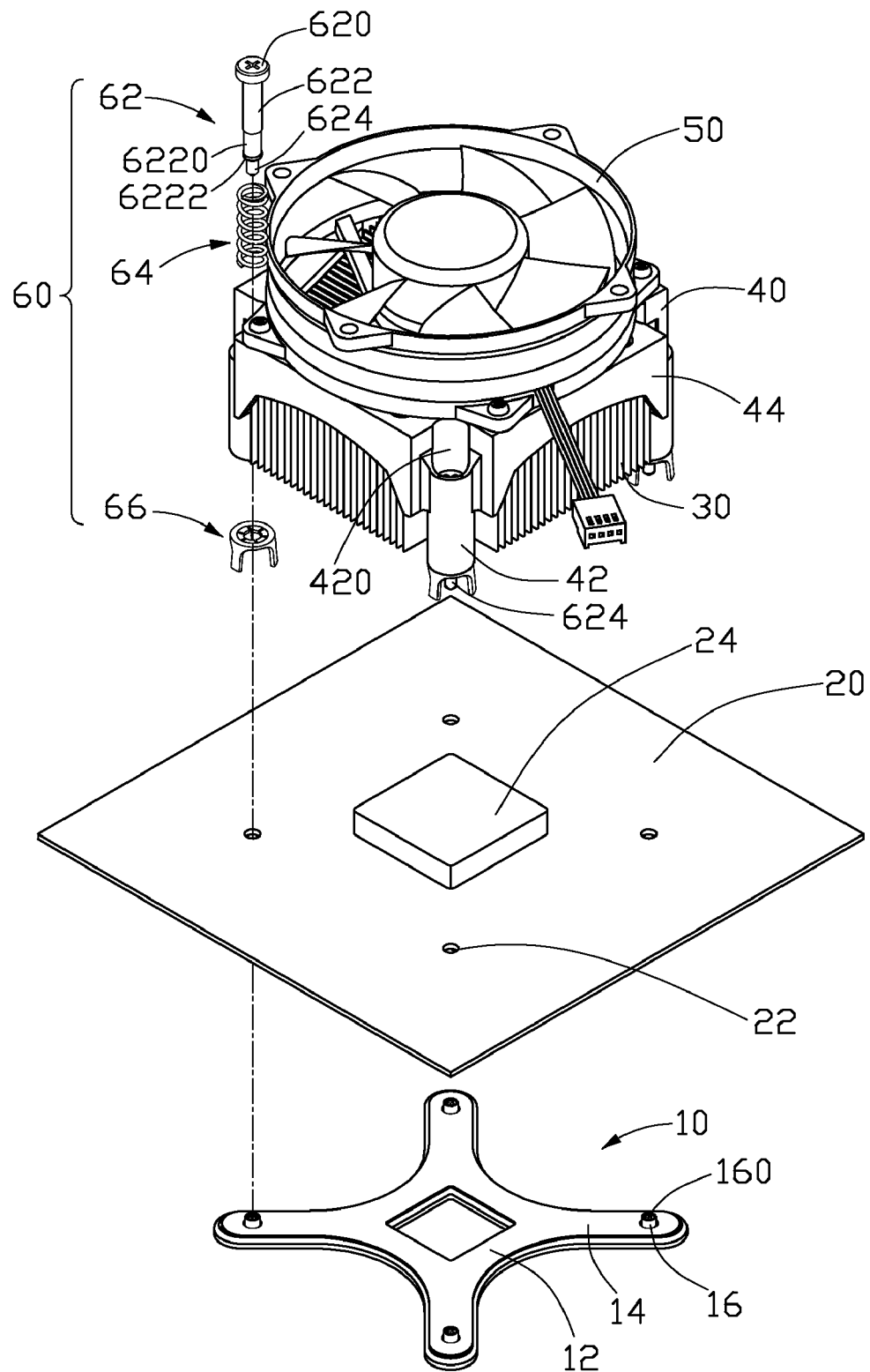
FIG. 1 is an exploded view of a heat sink assembly in accordance with a first embodiment of the present invention, together with a printed circuit board and a back plate located below the printed circuited board.
Figure 2:
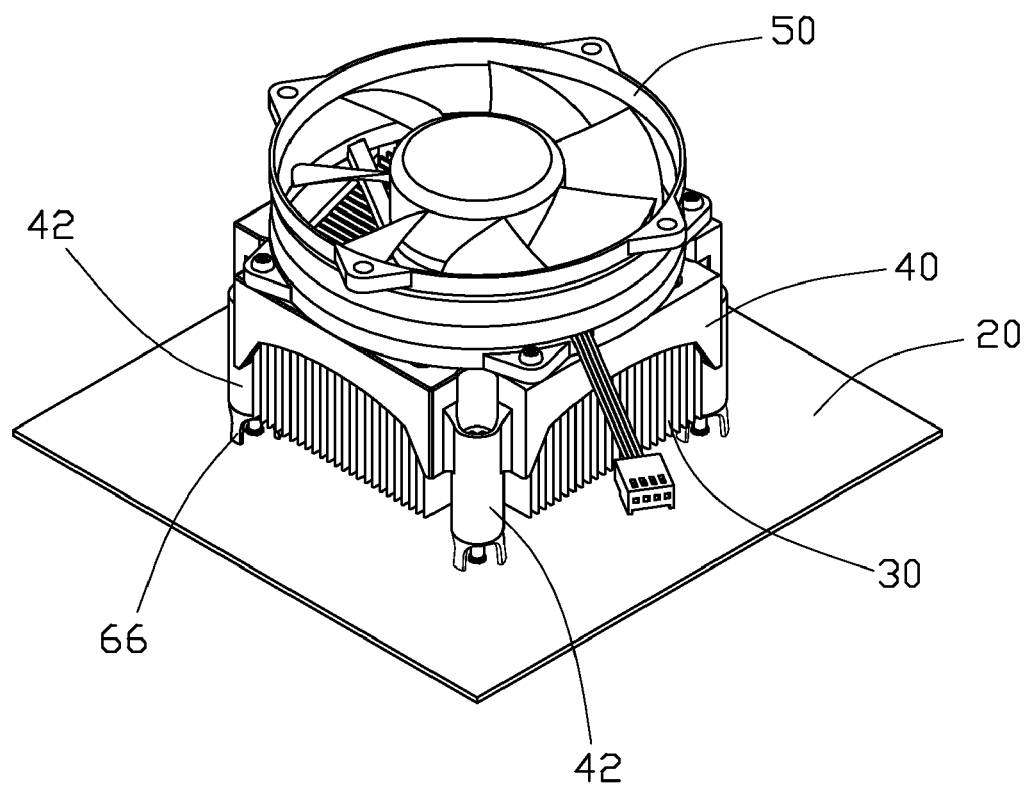
FIG. 2 is an assembled view of FIG. 1.

Referring to FIGS. 1-2, a heat sink assembly in accordance with a first embodiment of the present invention is illustrated. The heat sink assembly is used to cool down a heat-generating electronic component such as a central processing unit (CPU) 24 mounted on a printed circuit board 20, which has four through holes 22 defined around the CPU 24.

The heat sink assembly comprises a heat sink 30 contacting the CPU 24, a fan holder 40 covering the top of the heat sink 30, a fan 50 mounted on a top of the heat sink 30 via the fan holder 40, a back plate 10 located below the printed circuit board 20, and four fasteners 60 for extending through the heat sink 30 and the through holes 22 of the printed circuit board 20 to engage with the back plate 10, wherein the heat sink 30 and the fan holder 40 cooperatively construct an unit (not labeled). The heat sink 30 has a post (not shown) contacting with the CPU 24 and a plurality of fins (not labeled) extending outwardly from a circumference of the post. Four spaces (not labeled) are defined at four corners of the heat sink 30 for receiving a corresponding portion of the fan holder 40. The fan holder 40 comprises a top plate 44 mounted on a top of the heat sink 30 and four sleeves 42 extending downwardly from four corners of the top plate 44. The top plate 44 defines an opening (not labeled) at a center thereof for providing a passage of an airflow generated by the fan 50. The sleeves 42 are oriented perpendicular to the printed circuit board 20 and received in the four spaces of the heat sink 30. Each sleeve 42 has a hollow body (not labeled) and defines a positioning hole 420 in the hollow body corresponding to a corresponding through hole 22 of the printed circuit board 20, for a corresponding fastener 60 to extend therethrough. An annular project (not shown) is formed around an inner face of the through hole 22 at located at a bottom of the sleeve 42, for supporting the fastener 60.

The fasteners 60 corresponding to the sleeves 42 of the fan holder 40 are used for extending through the positioning hole 420 of the sleeves 42 and the through holes 22 of the printed circuit board 20 to mount the heat sink 30 on the CPU 24 of the printed circuit board 20. Each fastener 60 comprises a bolt 62, a spring 64 mounted around the bolt 62 and a supporting clip 66 positioned on a lower portion of the bolt 62 and located below the spring 64.

The bolt 62 comprises a circular head 620 having two intersecting perpendicular slots (not labeled) in a top surface therein for engaging a tip of a screwdriver (not shown) therein. A diameter of the head 620 is smaller than that of the positioning hole 420 of the sleeve 42 of the fan holder 40 such that the head 620 of the bolt 62 can be received in the positioning hole 420 of the sleeve 42 of the fan holder 40. The bolt 62 forms an elongated shaft 622 extending downwardly from the head 620 and terminated with an engaging portion 624 having threads (not shown) formed thereon. An annular recess 6220 is defined in the shaft 622 and near the engaging portion 624, while a part of the shaft 62 between the recess 6220 and the engaging portion 624 forms a protruding annulus 6222 for abutting against the supporting clip 66, to thereby prevent it from sliding from the shaft 62. The shaft 622 has a diameter smaller than that of the head 620 and a height larger than that of the sleeve 42 of the fan holder 40 such that the shaft 622 of the bolt 62 is capable of moving freely in the sleeve 42 of the fan holder 40 during installation of the heat sink assembly to the printed circuit board 20.

The spring 64 is dimensioned to loosely fit around the shaft 622. The spring 64 has an outer diameter smaller than that of the head 620 of the bolt 62 such that the head 620 of the bolt 62 contacts the spring 64 when installed. The spring 64 is compressed between the head 620 and the project of the sleeve 42, for exerting a spring force downwardly on the heat sink 30 when the fastener 60 is threadedly fastened to the back plate 10. The outer diameter of the spring 64 is larger than the diameter of the through hole 22 of the printed circuit board 20.

Figure 4:
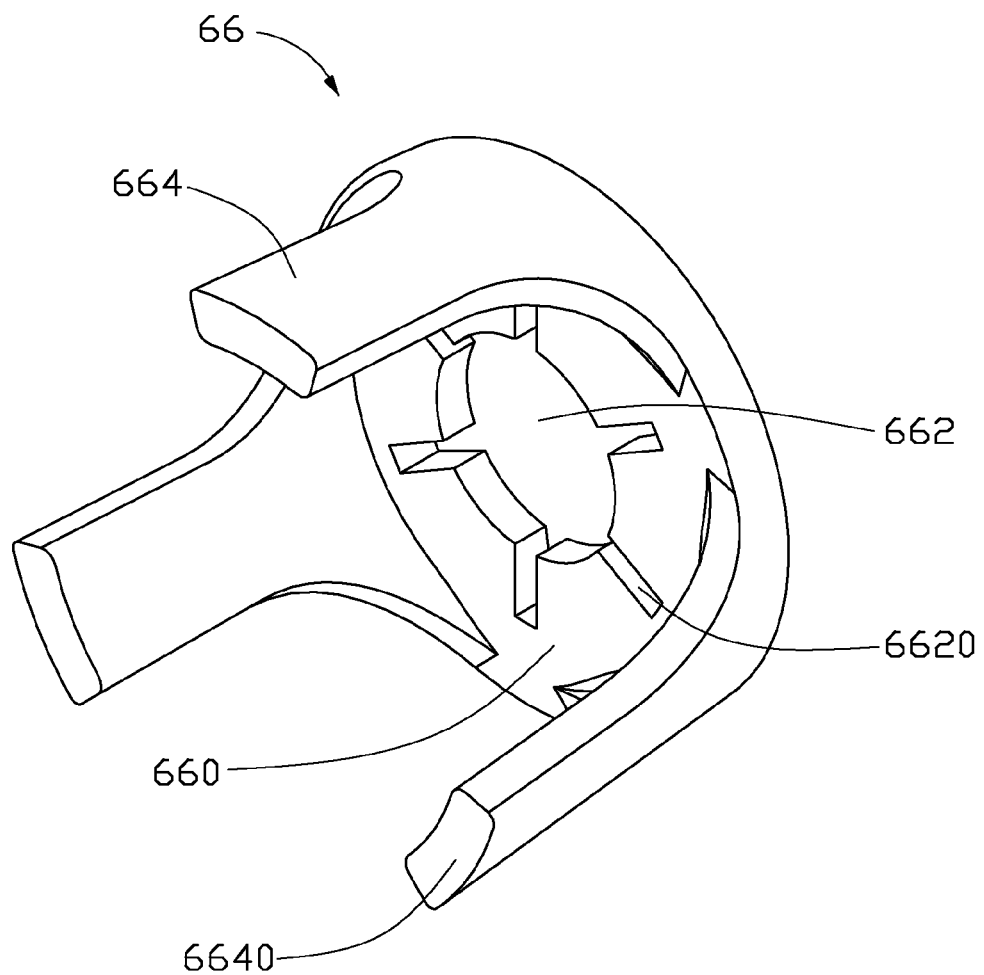
FIG. 4 is an enlarged view of a supporting clip of the heat sink assembly of FIG. 1.

Referring also to FIG. 4, the annular supporting clip 66 comprises an annular body 660 defining a central bore 662 therein. The body 660 has an outer diameter essentially identical to that of the sleeve 42; thus, the annular supporting clip 66 can abut against a bottom of the sleeve 42 for supporting the sleeve 42 thereon, when the bolt 62 extends through the positioning hole 420 of the sleeve 42 and the through hole 22 of the printed circuit board 20 to engage with the back plate 10. The central bore 662 of the supporting clip 66 is for being engaged in the recess 6220 of the bolt 62. A plurality of elongated slots 6620 communicating with the central bore 662 are defined around the central bore 662 for providing elasticity to the annular supporting clip 66, whereby the annular supporting clip 66 can resiliently engage with the lower portion of the shaft 622 of the bolt 62. The supporting clip 66 further comprises three supporting legs 664 extending perpendicularly and downwardly from a circumferential periphery of the annular body 660. The supporting legs 664 are symmetrically located around the circumferential periphery of the annular body 660 of the supporting clip 66. The supporting legs 664 have identical heights to each other and each have a flat bottom 6640 coplanar with each other such that the supporting clip 66 can have a steady supporting point on the top surface of the printed circuit board 20 when the supporting clip 66 is sandwiched between a bottom of the unit and the top surface of the printed circuit board 20.

Back to FIG. 1, the back plate 10 is located under the printed circuit board 20 opposite the CPU 24 mounted on the top surface of the printed circuit board 20. The back plate 10 comprises a base 12 for abutting against a bottom side of the printed circuit board 20, and four arms 14 symmetrically and outwardly extending from corners of the base 12. Each arm 14 forms an extending socket 16 extending upwardly from a free end thereof for allowing the engaging portion 624 of the fastener 60 to be engaged therein. A center of each extending socket 16 defines a thread hole 160 therein for receiving and threadedly engaging with the fastener 60.

In assembly, the bolt 62 is firstly pushed to extend through the spring 64, then is inserted downwardly into the positioning hole 420 of the corresponding sleeve 42 and through the bore 662 of the corresponding annular supporting clip 66. The supporting clip 66 is engaged in the recess 6220 of the shaft 622 adjacent to the engaging portion 624 of the bolt 62, after the lower portion of the bolt 62 extends beyond the heat sink 30. The heat sink 30 is disposed on the printed circuit board 20 with the post contacting the CPU 24, and the sleeves 42 in alignment with the through holes 22 of the printed circuit board 20. The supporting clip 66 is located between a bottom of the sleeve 42 and the top surface of the printed circuit board 20 and corresponding to the through hole 22 of the printed circuit board 20 with the body 660 contacting a bottom of the sleeve 42. The back plate 10 is readily positioned below the printed circuit board 20 with its sockets 16 corresponding to the through holes 22 of the printed circuit board 20.

Figure 3:
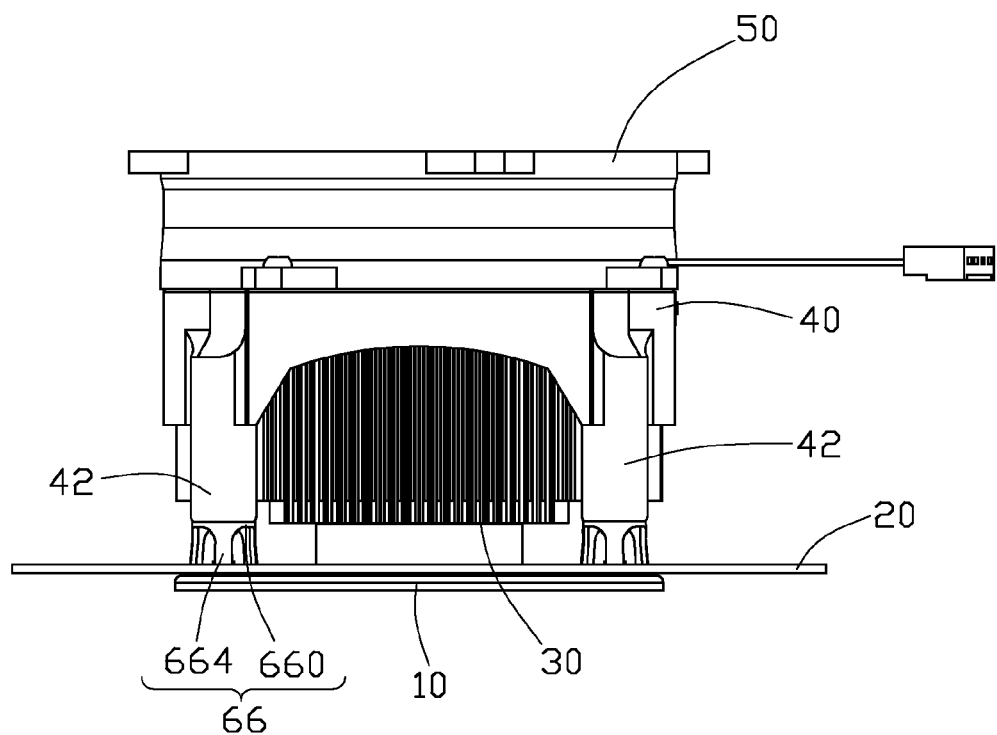
FIG. 3 is side view of FIG. 2.

During operation, referring to FIGS. 1-3, a downward force acts on the head 620 of the bolt 62 to overcome the resilient force of the spring 64, to thereby cause the bolt 62 to move downwardly relative to the sleeve 42. Simultaneously, the engaging portion 624 of the bolt 62 extends through the through hole 22 of the printed circuit board 20 and is engaged in a corresponding thread hole 160 of the extending socket 16 of the back plate 10. Thus, one of the corners of the heat sink 30 is securely mounted to the top surface of the printed circuit board 20. In this process, a vertical distance between a bottom face of the heat sink 30 and the top surface of the printed circuit board 20 remains unchanged, that is to say, no movement of the heat sink 30 occurs during assembling, and the heat sink 30 maintains a stable state all the time. Owning to the supporting by the three supporting legs 664 of the supporting clip 66, the bottom face of the heat sink 30 would not move downwardly relative to the top surface of the printed circuit board 20 even if the spring 64 downwardly pressing against the project of the sleeve 42 with respect to the supporting clip 66. when the bolt 62 is forced to downwardly move to engage with the extending socket 16 of the back plate 10, the corner of the heat sink 30 is positioned by the supporting clip 66, the other corners of the heat sink 30 supporting by the supporting legs 664 of the supporting clips 66 still stay at their original states, whereby the other corners of the heat sink 30 are not cocked though only the one corner of the heat sink 30 is securely mounted to the top surface of the printed circuit board 20.

Figure 5:
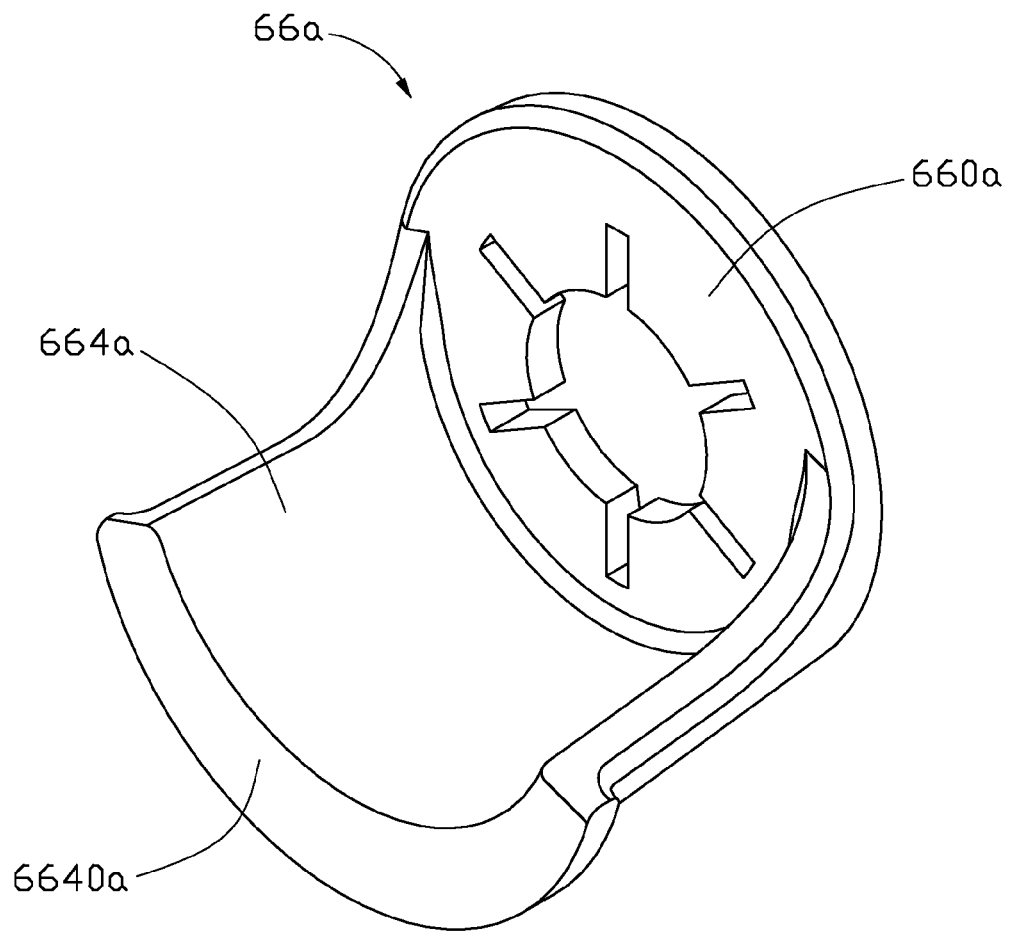
FIG. 5 is an enlarged view of a supporting clip of a heat sink assembly in accordance with a second embodiment of the present invention.

FIG. 5 illustrates an enlarged view of a supporting clip of a heat sink assembly in accordance with a second embodiment of the present invention. The supporting clip 66a comprises a body 660a and a supporting leg 664a instead of the three supporting legs 664 of the supporting clip 66 in the first embodiment of the present invention. The supporting leg 664a extends downwardly from more than half a circumferential periphery of the body 660a of the supporting clip 66a. The supporting leg 664a has an arc-shaped outer surface and a flatted surface 6640a at a bottom end thereof for increasing contacting area with a top surface of a printed circuit board 20, thereby to offer a supporting force to the heat sink 30 when assembling.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink assembly comprising:
   an unit comprising a heat sink adapted for attachment with a heat-generating electronic component mounted on a printed circuit board;
   a back plate adapted for being located below the printed circuit board;
   a plurality of pre-assembled fasteners respectively extending through the unit for fixing the unit to the back plate, each fastener comprising:
   a bolt comprising a head, a shaft extending from the head and a spring sleeved on the shaft, the shaft having an engaging portion at an end thereof; and
   a supporting clip located below a bottom of the unit, the supporting clip comprising a body snapping a lower portion of the shaft, and a supporting leg extending from the body adapted for abutting against the printed circuit board, wherein each bolt extends through the unit with its head downwardly pressing the spring to make it compressibly engages the bottom of the unit, and its engaging portion engaging with the back plate, the bottom of the unit abuts against the body of the supporting clip to be supported by the supporting clip, whereby a movement of the unit is prevented as an extension of the fastener through the unit and an engagement of the fastener with the back plate.

2. The heat sink assembly as claimed in claim 1, wherein the unit comprises a fan holder located at a top of the heat sink, the fan holder comprising a plurality of sleeves for the bolts of the fasteners extending therethrough.

3. The heat sink assembly as claimed in claim 2, wherein the sleeves of the fan holder are located at four corners of the heat sink and each have a hollow body receiving a corresponding bolt therein.

4. The heat sink assembly as claimed in claim 2, wherein the spring is compressibly sandwiched between the head and the bottom of the sleeve.

5. The heat sink assembly as claimed in claim 1, wherein the support has an arc-shaped configuration extending from a half periphery of the body.

6. The heat sink assembly as claimed in claim 1, wherein the supporting clip further comprises two supporting legs formed on the body, the three supporting legs being located evenly around a circumferential periphery of the body with bottom surfaces thereof being located in a same plane.

7. The heat sink assembly as claimed in claim 1, wherein the body of each supporting clip defines a central bore therein, a corresponding bolt being extended through the central bore of the supporting clip.

8. The heat sink assembly as claimed in claim 7, wherein the body of the supporting clip defines a plurality of radial, elongated slots communicating with and around the central bore for providing elasticity to the supporting clip.

9. An electronic assembly, comprising:
   a printed circuit board having an electronic component mounted on a top surface thereof, the printed circuit board defining a plurality of through holes around the electronic component;
   an unit mounted to the top surface of the printed circuit board, the unit defining a plurality of positioning holes therein corresponding to the through holes of the printed circuit board;
   a back plate attached to a bottom surface of the printed circuit board, the back plate having a plurality of extending sockets extending upwardly through the printed circuit board; and
   a plurality of pre-assembled fasteners respectively extending through the positioning holes and the through holes of the printed circuit board, each fastener comprising:
   a bolt comprising a head formed at an end thereof, an engaging portion formed at an opposite end thereof, a shaft located between and interconnecting the head and the engaging portion, and a spring sleeved onto the shaft; and
   a supporting clip disposed between a bottom of the unit and the printed circuit board and corresponding to a corresponding positioning hole, the supporting clip comprising a body abutting against the bottom of the unit, and a supporting leg extending from the body toward the printed circuit board;
   wherein the bolt of each fastener extends through the corresponding positioning hole and the through hole of the printed circuit board and engages with a corresponding extending socket of the back plate to mount the unit to the printed circuit board, and wherein the bottom of the unit is supported by the supporting legs of the supporting clips of the fasteners, with the spring being compressed between the head of the bolt and the bottom of the unit to press the unit toward the printed circuit board, since a distance between the bottom of the unit and the top surface of the printed circuit board is unchanged during the bolts of the fasteners engaging with the extending socket of the back plate.

10. The electronic assembly as claimed in claim 9, wherein the unit has a fan holder attached to a top of the heat sink, the positioning holes being defined in four corners of the fan holder.

11. The electronic assembly as claimed in claim 10, wherein the fan holder comprises four sleeves formed at the four corners thereof and each sleeve defines the positioning hole therein.

12. The electronic assembly as claimed in claim 9, wherein the support extends from more than half of a circumferential periphery of the body of the supporting clip and has a flatted bottom abutting against the top surface of the printed circuit board.

13. The electronic assembly as claimed in claim 9, wherein three supporting legs are formed from a circumferential periphery of the body of the supporting clip and support the bottom of the unit above the top surface of the printed circuit board.

* * * * *